(12) United States Patent
Watts et al.

(10) Patent No.: US 9,673,164 B2
(45) Date of Patent: Jun. 6, 2017

(54) SEMICONDUCTOR PACKAGE AND SYSTEM WITH AN ISOLATION STRUCTURE TO REDUCE ELECTROMAGNETIC COUPLING

(71) Applicant: FREESCALE SEMICONDUCTOR, INC., Austin, TX (US)

(72) Inventors: Michael E. Watts, Scottsdale, AZ (US); Shun Meen Kuo, Chandler, AZ (US); Margaret A. Szymanowski, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/261,899

(22) Filed: Apr. 25, 2014

(65) Prior Publication Data

US 2015/0311131 A1    Oct. 29, 2015

(51) Int. Cl.
*H01L 23/552* (2006.01)
*H01L 23/00* (2006.01)
*H01L 23/31* (2006.01)

(52) U.S. Cl.
CPC ............ *H01L 24/49* (2013.01); *H01L 23/552* (2013.01); *H01L 23/3121* (2013.01); *H01L 24/05* (2013.01);
(Continued)

(58) Field of Classification Search
CPC ... H01L 2924/0002; H01L 2924/00014; H01L 2224/48091; H01L 2924/1305;
(Continued)

(56) References Cited

U.S. PATENT DOCUMENTS 3,500,440 A * 3/1970 Hastings ..................... 174/387
4,370,700 A    1/1983 Duddles et al.
(Continued)

FOREIGN PATENT DOCUMENTS

EP    2 584 605 A2    4/2013
EP    2858240 A1    4/2015
(Continued)

OTHER PUBLICATIONS

U.S. Appl. No. 14/549,934, Viswanathan et al., filed Nov. 21, 20014.
(Continued)

*Primary Examiner* — Xinning Niu
*Assistant Examiner* — Vu A Vu (57) ABSTRACT

A system and method for packaging a semiconductor device that includes a structure to reduce electromagnetic coupling is presented. The semiconductor device has a substrate on which a first circuit and a second circuit with inputs and outputs are formed proximate to each other. An isolation structure of electrically conductive material is located between components of the first and second circuits, the isolation structure being configured to reduce inductive coupling between those components during an operation of the semiconductor device. The isolation structure may be positioned on or over exterior surfaces of the semiconductor device housing or inside the housing. In one embodiment, the isolation structure includes a first leg extending transverse to the surface of the substrate and a first cross member connected to and projecting from the first leg over the substrate.

26 Claims, 3 Drawing Sheets

(52) U.S. Cl.
CPC .............. *H01L 24/06* (2013.01); *H01L 24/48* (2013.01); *H01L 2224/04042* (2013.01); *H01L 2224/05553* (2013.01); *H01L 2224/05599* (2013.01); *H01L 2224/06135* (2013.01); *H01L 2224/45099* (2013.01); *H01L 2224/48195* (2013.01); *H01L 2224/48247* (2013.01); *H01L 2224/49109* (2013.01); *H01L 2224/49111* (2013.01); *H01L 2224/49175* (2013.01); *H01L 2224/85399* (2013.01); *H01L 2924/00014* (2013.01); *H01L 2924/19041* (2013.01); *H01L 2924/19105* (2013.01); *H01L 2924/19107* (2013.01); *H01L 2924/30107* (2013.01)

(58) Field of Classification Search
CPC ..... H01L 2924/3011; H01L 2924/3025; H01L 2924/13091; H01L 2224/05552; H01L 2224/48137; H01L 2924/14; H01L 22/20; H01L 22/34
USPC ........................................................ 257/659
See application file for complete search history.

(56) References Cited

U.S. PATENT DOCUMENTS

| | | | |
|---|---|---|---|
| 5,068,708 A | 11/1991 | Newman | |
| 5,191,544 A | 3/1993 | Benck et al. | |
| 5,261,868 A | 11/1993 | Pryor et al. | |
| 5,485,037 A | 1/1996 | Marrs | |
| 5,557,063 A | 9/1996 | Mottahed | |
| 5,608,188 A | 3/1997 | Choon et al. | |
| 5,661,337 A | 8/1997 | Manteghi | |
| 5,663,597 A | 9/1997 | Nelson et al. | |
| 6,121,546 A | 9/2000 | Erickson et al. | |
| 6,261,868 B1 | 7/2001 | Miller et al. | |
| 6,614,102 B1 | 9/2003 | Hoffman et al. | |
| 7,075,174 B2 * | 7/2006 | Brennan | H01L 23/047 257/675 |
| 7,400,216 B2 * | 7/2008 | Fuse | 333/133 |
| 7,432,586 B2 * | 10/2008 | Zhao | H01L 23/24 257/678 |
| 7,445,967 B2 | 11/2008 | Abdo et al. | |
| 7,463,496 B2 * | 12/2008 | Robinson et al. | 361/818 |
| 7,629,674 B1 | 12/2009 | Foster | |
| 7,701,724 B2 | 4/2010 | Tanaka et al. | |
| 7,846,773 B2 | 12/2010 | Galera et al. | |
| 7,868,471 B2 | 1/2011 | Camacho et al. | |
| 8,030,763 B2 | 10/2011 | Romero et al. | |
| 8,654,537 B2 | 2/2014 | Fisher, Jr. et al. | |
| 8,698,291 B2 | 4/2014 | Sanchez et al. | |
| 2002/0047088 A1 | 4/2002 | Ishii et al. | |
| 2009/0322430 A1 | 12/2009 | Romero et al. | |
| 2010/0290191 A1 | 11/2010 | Lin et al. | |
| 2011/0001587 A1 | 1/2011 | Sutardja | |
| 2013/0119523 A1 * | 5/2013 | Cheng | H01L 23/552 257/659 |
| 2014/0022020 A1 | 1/2014 | Aaen et al. | |
| 2014/0167858 A1 | 6/2014 | Van Zuijlen et al. | |
| 2015/0303879 A1 | 10/2015 | Murao | |

FOREIGN PATENT DOCUMENTS

| | | |
|---|---|---|
| WO | 2006/008679 A2 | 1/2006 |
| WO | 2013179382 A1 | 12/2013 |

OTHER PUBLICATIONS

U.S. Appl. No. 13/929,688, Kuo et al., filed Jun. 27, 2013.
U.S. Appl. No. 14/261,387, Kuo et al., filed Apr. 24, 2014.
U.S. Appl. No. 14/104,870, Szymanowski, filed Dec. 12, 2014.
Partial European Search Report mailed Jun. 8, 2015 for EP14196131, 5 pages.
Non-Final Office Action mailed Mar. 27, 2015 for U.S. Appl. No. 14/104,870, 17 pages.
Non-Final Office Action mailed Oct. 14, 2015 for U.S. Appl. No. 14/104,870, 23 pages.
Notice of Allowance and Fees mailed Aug. 26, 2016 for U.S. Appl. No. 14/104,870, 7 pgs.
Requirement for Restriction/Election mailed Oct. 5, 2016 for U.S. Appl. No. 14/549,934, 7 pgs.
Extended European Search Report for Patent Appln. No. 14196131.8 (Jan. 18, 2016).
Non-Final Office Action mailed Jan. 23, 2017 for U.S. Appl. No. 14/104,870, 18 pgs.

* cited by examiner

SEMICONDUCTOR PACKAGE AND SYSTEM WITH AN ISOLATION STRUCTURE TO REDUCE ELECTROMAGNETIC COUPLING

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND

Field of Use

The present disclosure relates generally to semiconductor device packages, and more specifically, to such packages and systems incorporating a mechanism to reduce electromagnetic coupling between adjacent components in the semiconductor device packages.

Description of the Related Art

Wireless communication systems often employ power amplifiers for increasing the power of a signal. In a wireless communication system, a power amplifier is usually the last amplifier in a transmission chain (the output stage). High gain, high linearity, stability, and a high level of power-added efficiency (i.e., the ratio of the difference between the output power and the input power to DC power) are characteristics of an ideal amplifier.

In general, a power amplifier operates at maximum power efficiency when the power amplifier transmits peak output power. However, power efficiency tends to worsen as output power decreases. Recently, Doherty power amplifier architecture has been the focus of attention not only for base stations, but also for mobile terminals because of the architecture's high power-added efficiency.

A Doherty power amplifier includes two or more amplifiers, such as a carrier amplifier and a peaking amplifier. These amplifiers can be connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

Such power amplifiers commonly are fabricated in a single semiconductor package. However, the circuit architecture presents challenges in terms of the semiconductor package design. Present Doherty power amplifier semiconductor package design calls for the use of discrete devices and integrated circuits that may involve one device which includes the carrier amplifier and a separate device that includes the peaking amplifier. These discrete devices are maintained a distance apart in the package in order to limit problems with crosstalk that can occur between the carrier and peaking amplifiers.

Unfortunately, maintaining the requisite spatial distance between amplifiers in the package limits the potential for miniaturization of the semiconductor package. Limiting miniaturization is undesirable where low cost, a low weight, and a small volume are important package attributes for various applications.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

The following detailed description is exemplary in nature and is not intended to limit the invention or the application and uses of the same. Furthermore, there is no intention to be bound by any expressed or implied theory presented in the preceding technical field, background, or the following detailed description.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "directly electrically connected" means that the associated components are connected together either by abutting each other or by an electrical conductive element that does not restrict or control the flow of electric current beyond the inherent restriction of any electrical conductor. The term "coupled," as used herein, is defined as directly or indirectly connected in an electrical or non-electrical manner. The terms "substantial" and "substantially" herein mean sufficient to accomplish the stated purpose in a practical manner and that minor imperfections, if any, are not significant for the stated purpose.

The present embodiments may be used to improve the usability of a power amplifier semiconductor package in base station power amplifiers, cell phones, other portable devices, and other apparatus dependent upon semiconductor packages, where low cost, low weight, and small volume are desired. The embodiments described herein may reduce inductive coupling between components and wire bond arrays in a multi-path power amplifier (including but not limited to Doherty power amplifiers). However, it will become apparent that the techniques described below for reducing inductive coupling and electromagnetic interference may be implemented in a variety of semiconductor device designs and other circuits.

Figure 1:
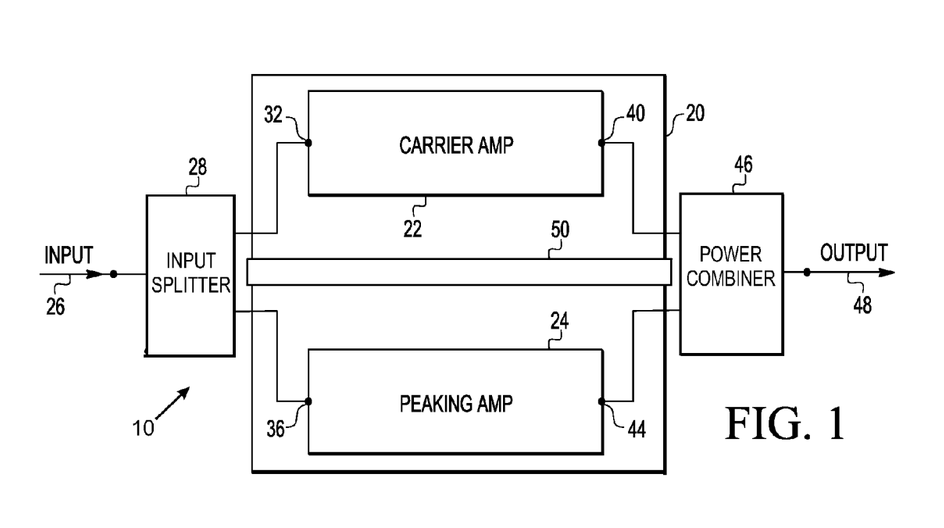
FIG. 1 is a block diagram of an example embodiment of a Doherty power amplifier in a semiconductor package with an isolation structure.

FIG. 1 shows a block diagram of a Doherty power amplifier 10 that includes a carrier amplifier 22 and a peaking amplifier 24 connected in parallel. The carrier amplifier 22 and peaking amplifier 24 are fabricated in a semiconductor package 20. An input signal 26 is divided into two signals by an input splitter 28, which may apply a phase delay to one of the signals (e.g., a 90 degree phase delay). The input splitter 28 may be coupled to a printed circuit board (not illustrated) or other substrate to which the semiconductor package 20 is coupled, or the input splitter 28 may be included within the semiconductor package 20. One of the resulting input signals is applied to a first input 32 of the carrier amplifier 22, and the other input signal is applied to a second input 36 of the peaking amplifier 24. The carrier amplifier 22 produces a first output signal at a first output 40 and the peaking amplifier 24 produces a second output signal at a second output 44. In a Doherty configuration, the first input 32 and the first output 40 may constitute a gate terminal and a drain terminal of the carrier amplifier 22, respectively; and the second input 36 and the second output 44 may constitute a gate terminal and a drain terminal of the peaking amplifier 24, respectively. The first and second output signals are combined through a power combiner 46 to produce a combined output signal 48. The power combiner 46 may be coupled to a printed circuit board (not illustrated) or other substrate to which the semiconductor package 20 is coupled, or the power combiner 46 may be included within the semiconductor package 20. Those skilled in the art will recognize that a Doherty power amplifier semiconductor package typically includes additional electronic devices and circuitry not shown herein for simplicity of illustration.

In one embodiment, the carrier amplifier 22 is configured to be active for an entire range of output powers of Doherty power amplifier 10. Peaking amplifier 24 is configured to turn on only when the carrier amplifier 22 saturates. Power combiner 46, operating to combine the first output signal from the carrier amplifier 22 with the second output signal from peaking amplifier 24, may include a quarter-wave impedance inverter. The quarter-wave impedance inverter can add a ninety degree lag to the output signal from the carrier amplifier 22 or the peaking amplifier 24 in order to compensate for the phase delay added by the input splitter to the signal provided to either the peaking amplifier 24 or the carrier amplifier. The phase of the signal provided to peaking amplifier 24 is typically designed to lag that of the carrier amplifier 22 by ninety degrees so that the two output signals add in-phase when the output signals are combined at the output of power combiner 46 to form combined output signal 48.

In the exemplary circuit in FIG. 1, each of the carrier amplifier 22 and peaking amplifier 24 may include a number of active and passive electrical elements. For example, the carrier amplifier 22 may include a first capacitor that couples the first input 32 to a first transistor, which applies the appropriate amplification to the first input signal received at that input. An output of the first transistor can be connected to a second capacitor. The first and second capacitors operate to condition the input first signal that is amplified by the first transistor. Similarly, the peaking amplifier 24 can include a third capacitor coupling the second input 36 to a second transistor, which applies the appropriate amplification to the second input signal received at the second input. An output of the second transistor can be connected to a fourth capacitor. The third and fourth capacitors operate to condition the input second signal that is amplified by the second transistor. Those skilled in the art will recognize that the carrier amplifier 22 and peaking amplifier 24 may include additional electronic components not shown herein for simplicity of illustration.

Figure 2:
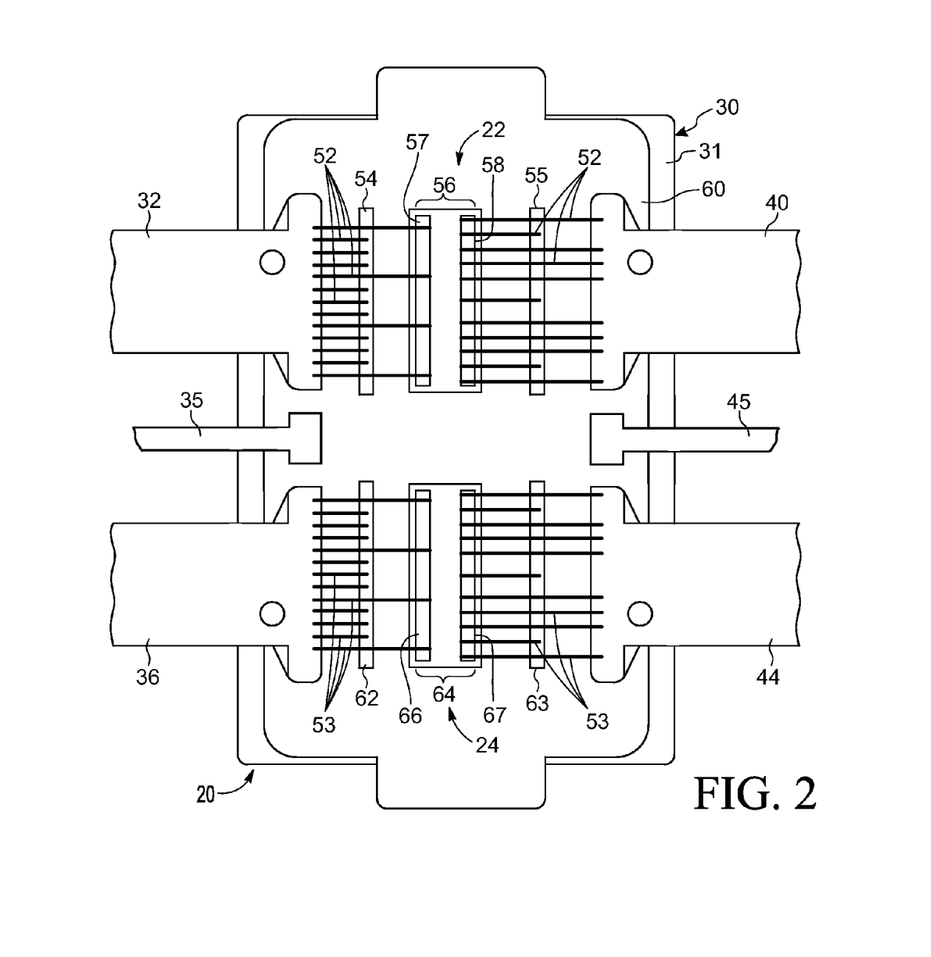
FIG. 2 is a top schematic view of components of the carrier and peaking amplifiers for an example embodiment of a Doherty power amplifier in a semiconductor package.

With reference to the semiconductor package 20 in FIG. 2, the separate electrical components forming the carrier amplifier 22 and the peaking amplifier 24 are components, such as capacitors 54 and 55 and transistor 56 (having gate pad 57 and drain pad 58) fabricated on and/or subsequently mounted to a common (i.e., single) substrate 30, particularly a surface of a ground plane 60, for example. Substrate 30 and ground plane 60 may be distinct features of semiconductor package 20, or substrate 30 and ground plane 60 may be a single feature (e.g., an embodiment may include a solid, conductive flange to which the components forming the carrier amplifier 22 and the peaking amplifier 24 are directly mounted). Similarly, the peaking amplifier 24 includes a number of electrical devices, such as capacitors 62 and 63 and transistor 64 (having gate pad 66 and drain pad 67) fabricated on or subsequently mounted to the surface of the ground plane 60 located on surface 31 of the substrate 30. Capacitors 54, 55, 62 and 63 may be, for example, metal-oxide-semiconductor (MOS) capacitors on ground plane 60. The ground plane 60 is electrically connected to the first and second ground connectors 35 and 45. The carrier amplifier 22 and the peaking amplifier 24 respectively form first and second circuits on the substrate 30 and combined form the electronic circuitry within the semiconductor package 20.

In a practical application, one or more of the signal paths (e.g., between inputs, outputs, capacitors, transistors and other components) of the carrier amplifier 22 are established using wire bonds 52. Likewise, wire bonds 53 may be used to establish one or more of the signal paths for the peaking amplifier 24.

A first ground connector 35 is located between the first and second inputs 32 and 36 on one side of the semiconductor package 20 and a second ground connector 45 is located between the first and second outputs 40 and 44 on the opposite side of the semiconductor package. The first and second ground connectors 35 and 45 project outward from the exterior surfaces of the semiconductor package 20.

The symmetrical layout of the depicted semiconductor package 20 can result in the components of the carrier amplifier 22 being adjacent to corresponding components of the peaking amplifier 24. Accordingly, the arrangement of various components of each amplifier (including, specifically, the wire bonds 52 and 53 carrying high-frequency signals) are adjacent to and geometrically parallel with one another. These attributes of the wire bond arrays of the carrier and peaking amplifiers 22 and 24 can result in inductive signal coupling between the devices, which can reduce the performance of the overall circuitry.

To mitigate that inductive signal coupling, an electrically conductive isolation structure 50, shown in FIG. 1, is formed between the carrier amplifier 22 and the peaking amplifier 24 to provide electrical isolation between the wire bonds arrays and other components of those amplifiers. The isolation structure 50, as described in greater detail below, is fabricated as a structure between the circuitry of the carrier amplifier and the circuitry of the peaking amplifier. As illustrated in FIGS. 3-7, an isolation structure (e.g., isolation structures 50, 100, 108) may include one or more "strips" (i.e., structures with relatively small thicknesses, when compared to their widths) of conductive material. Alternatively, an isolation structure may have significant thickness when compared to its width (e.g., the isolation structure may be in the form of a wall of conductive material). The material of the isolation structure 50 conducts, absorbs, or reflects electromagnetic emissions from either or both the carrier amplifier 22 or the peaking amplifier 24 preventing or substantially preventing those emissions from reaching the other amplifier. In various embodiments, the isolation structure 50 may be connected directly to a ground plane 60 or to a ground terminal (e.g., either or both of ground connectors 35, 45) which in turn is connected to ground potential during operation of the Doherty power amplifier 10. Alternatively, the isolation structure 50 may be electrically connected to a ground conductor of a printed circuit board (not illustrated) on which the semiconductor package 20 is mounted. In other implementations, a circuit applies a bias potential or signal to the isolation structure 50. In general, the isolation structure 50 operates as a shield to interrupt and inhibit the inductive coupling between the carrier amplifier 22 and the peaking amplifier 24 of the Doherty power amplifier 10. The isolation structure 50 may be built on or applied over the exterior surface of the semiconductor package 20 or may be built within the semiconductor package 20. Although the isolation structure 50 may take any one of several forms, such as those which are being described in detail herein, other isolation structure configurations may be used to implement the present inventive concept.

Figure 3:
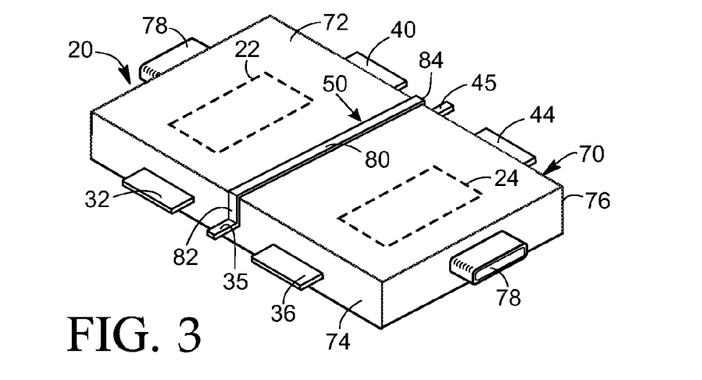
FIG. 3 is a perspective view illustrating one embodiment of the isolation structure.

With reference to an example in FIG. 3, the electronic circuitry of the Doherty power amplifier 10 is encapsulated or otherwise enclosed in a housing 70 of the semiconductor package 20. The housing 70 has a major surface 72 extending over the circuitry mounted on the substrate 30 and, for example, is substantially parallel to the substrate surface 31 on which that circuitry is mounted. The housing 70 further comprises a pair of edge surfaces 74 and 76 abutting opposite sides of the major surface 72 and extending, for example, orthogonally to that major surface 72 and the surface 31 of the substrate. The first and second inputs 32 and 36 and the first ground connector 35 extend through the first edge surface 74. Similarly, the first and second outputs 40 and 44 and the second ground connector 45 extend through the second edge surface 76. Other connectors 78 extend through the edge surfaces of the housing 70 to provide power and control signals to the circuits within the housing 70.

In this example, the isolation structure 50 is formed on or over the exterior surfaces of the housing 70 at a position that is between the carrier amplifier 22 and the peaking amplifier 24. In particular, the isolation structure 50 has a first leg 82 electrically connected directly to the first ground connector 35 and extending along the first edge surface 74 to the major surface 72. A cross member 80 extends over and across the major surface 72 from a direct electrical connection to the first leg 82 to a point where the major surface abuts the second edge surface 76. At that point, the cross member 80 is directly connected to a second leg 84 that extends downward along the second edge surface 76 to a direct connection with the second ground connector 45. As a result, the first and second legs 82 and 84 are transverse (e.g., orthogonal) to the cross member 80 and to the plane of the substrate surface 31. Thus, the isolation structure 50 has an inverted U-shape conforming to the surfaces of the housing 70 and being directly connected to the first and second ground connectors 35 and 45 on opposite sides of that housing. Instead of connecting the isolation structure 50 to the ground connectors 35 and 45, the isolation structure can be electrically connected to the grounded flange (e.g., substrate 30 or ground plane 60) for attaching the semiconductor package 20 to a heat sink. As another alternative, the isolation structure 50 can be electrically connected, such as by soldering for example, to one or more ground conductors of the printed circuit board on which the package 20 is mounted.

The first and second legs 82 and 84 and the cross member 80 in the embodiment of FIG. 3 have equal widths, for example, between 0.5 mm and 2.0 mm. Each of those elements of the isolation structure 50 have equal thickness up to 1.0 mm, for example. Nevertheless the elements 80, 82 and 84 may have different widths and thicknesses. It should be noted that the thickness of those elements is at least an order of magnitude less than the lengths of the first and second legs 82 and 84, in an embodiment. In alternate embodiments, the thickness of those elements may be larger, when compared with the lengths of the first and second legs 82 and 84.

The cross member 80 and the first and second legs 82 and 84 are formed of a conductive material, such as a metal, that is attached to, deposited on, or overlies the surfaces of the housing 70. The material of the isolation structure 50 conducts, absorbs, or reflects electromagnetic emissions from either or both of the carrier amplifier 22 and the peaking amplifier 24, thereby substantially preventing the high frequency signals in one amplifier from reaching the other amplifier. Although, the isolation structure 50 is being described for use with a Doherty power amplifier 10, these isolation structures can be used to mitigate inductive coupling between other types of electronic circuits and devices.

Although the embodiment of the isolation structure 50 in FIG. 3 has connections to the semiconductor package ground at opposite ends of the cross member 80, a ground connection at only one end or elsewhere along the length of the cross member 80 may be used.

Figure 4:
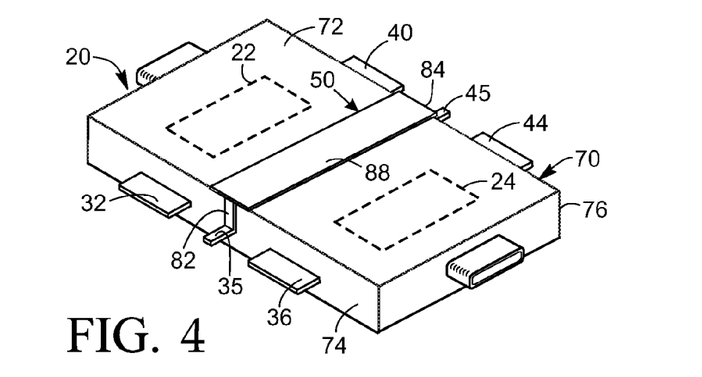
FIG. 4 is a perspective view showing another embodiment of the isolation structure.

FIG. 4 shows a variation of the isolation structure 50 in FIG. 3 in which the cross member 88 is significantly wider than the first and second legs 82 and 84, e.g. at least four times wider. For this exemplary semiconductor package, the cross member 88 is approximately eight times wider that the first and second legs 82 and 84.

Figure 5:
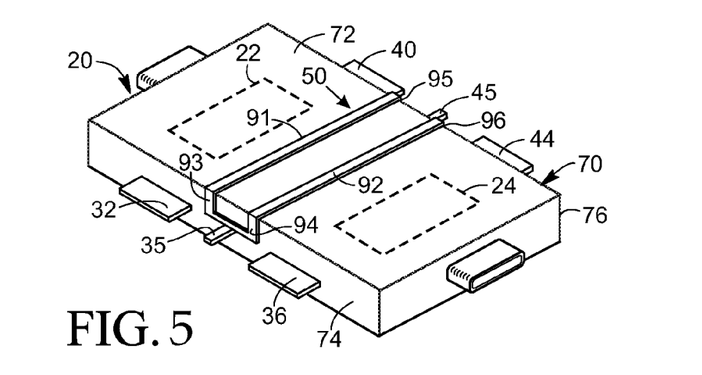
FIG. 5 is a perspective view illustrating a further embodiment of the isolation structure.

With reference to FIG. 5, another embodiment of the isolation structure 50 comprises two cross members 91 and 92 located in parallel on the major surface 72 of the housing 70 and extending over and across that surface between the first and second edge surfaces 74 and 76. A pair of first legs 93 and 94 are located on the first edge surface 74 and are electrically connected directly to the first and second cross members 91 and 92, respectively, and to the first ground connector 35. The first and second cross members 91 and 92 also may be electrically connected directly to a pair of second legs 95 and 96 located on the second edge surface 76 of the housing 70. The second legs 95 and 96 are electrically connected to the second ground connector 45.

Figure 6:
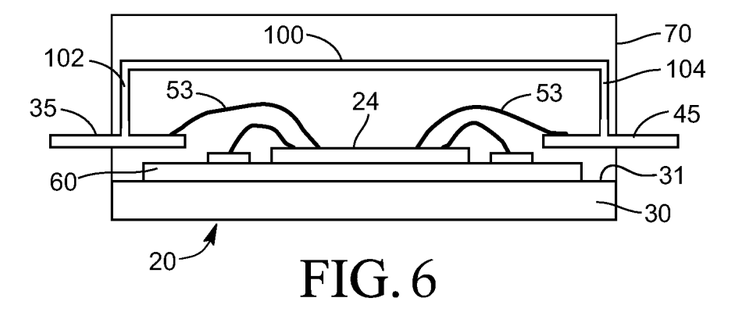
FIG. 6 is a cross section view through the semiconductor package showing yet another embodiment of the isolation structure.

All of the previously described embodiments of the isolation structure 50 are located on the exterior surfaces of the housing 70 that enclose the substrate 30 and the electronic circuitry of the semiconductor device. With reference to FIG. 6, an alternative embodiment of the isolation structure 50 is located within the housing 70 between the carrier amplifier 22 and the peaking amplifier 24 and above the substrate 30 and the circuits of those amplifiers. As with the other versions of the isolation structure, this embodiment has a cross member 100 extending above the amplifiers 22 and 24 substantially parallel to the surface 31 of the substrate 30.

A first leg 102 of the isolation structure 50 is electrically connected to one end of the cross member 100 and to the first ground connector 35. A similar second leg 104 extends between the opposite end of the cross member 100 and the second ground connector 45 being electrically connected to both those components. The first and second legs 102 and 104 are transverse (e.g., orthogonal) to the cross member 100 and to the substrate surface 31. The cross member 100 and the first and second legs 102 and 104 are located within the housing 70 between and above the carrier amplifier 22 and the peaking amplifier 24. For example, this isolation structure 50 may be formed by an electrical conductor, such as a wire, that has a rod or rectangular cross section and that is bent into an inverted U-shape. Alternatively, if an air cavity semiconductor package is used, the isolation structure 50 may be applied to interior surfaces of that package.

Instead of being directly connected to the ground connectors 35 and 45, one or both of the first and second legs 102 and 104 can electrically connect the cross member 100 to the ground plane 60 or another ground node of the circuitry inside the semiconductor package 20. As a further alternative, the cross member 100, that extends across and over the electronic circuits, can be electrically connected to the grounded flange (e.g., a unitary feature that includes the ground plane 60 and substrate 30) for attaching the semiconductor package 20 to a heat sink. As another alternative, the first and/or second legs 102 and 104 could be electrically connected, such as by soldering for example, to one or more ground conductor of the printed circuit board on which the semiconductor package is mounted.

Along with the circuitry and other components, the isolation structure and/or portions thereof may be over molded with an encapsulant to form the semiconductor package 20 or may be enclosed in a standard air cavity package.

Figure 7:
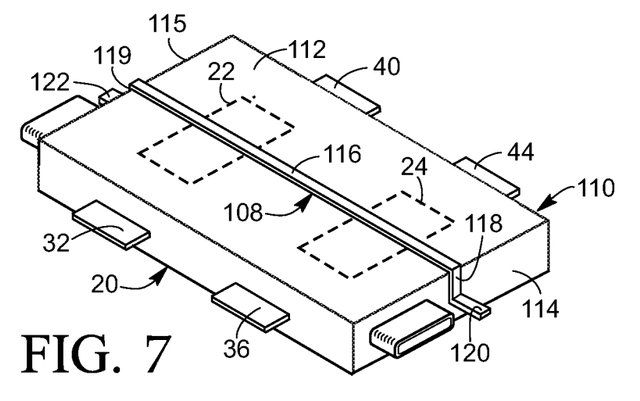
FIG. 7 is a perspective view illustrating an example of a version of the isolation structure employed to reduce coupling between an input and an output.

With reference to FIG. 7, the present isolation structure can be used to reduce inductive coupling between the input and the output of an electronic circuit. For example, an isolation structure 108 mitigates coupling of high frequency signals between the first input 32 and the first output 40 of the carrier amplifier 22 and also between the second input 36 and the second output 44 of the peaking amplifier 24 within the housing 110. To accomplish such input/output isolation, the isolation structure 108 is oriented orthogonally on the housing to the direction previously described for isolation between those amplifiers 22 and 24. Specifically, the housing 110 has a first edge surface 114 and a second edge surface 115 on opposite sides of the major surface 112, wherein those first and second edge surfaces 114, 115 are separated by the two edge surfaces through which the first and second inputs 32 and 36 and the first and second outputs 40 and 44 project. For input/output isolation, the isolation structure 108 has a cross member 116 attached to or overlying the major surface 112 and extending between the first and second edge surfaces 114 and 115. Therefore, the cross member 116 extends between the two inputs 32 and 36 and the two outputs 40 and 44. A first leg 118, located on or over the first edge surface 114, is in direct electrical connection with both the cross member 116 and a first ground connector 120. A second leg 119 is located on the opposite second edge surface 115 and is electrically connected directly to both the cross member 116 and a second ground connector 122 that projects through that second edge surface.

The cross member 116 instead of being electrically connected to the ground connectors 120 and 122 can be electrically connected to the ground plane 60, another ground node inside the housing 110, or to the grounded flange for attaching a heat sink to the semiconductor package 20. As a further alternative, the isolation structure 108 can be electrically connected, such as by soldering for example, to one or more ground conductors of the printed circuit board on which the package is mounted.

It should be understood that the isolation structure 108 that provides isolation between the input and output can have various configurations, such as those shown in FIGS. 4-6, for example. Furthermore, the input/output isolation structure 108 can be used on a semiconductor package that has a plurality of inputs and a plurality of outputs as in FIG. 7 or only one input and one output.

Although embodiments of the isolation structure have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the various embodiments are not limited to use with Doherty amplifiers, nor are they limited to use with amplifiers or other electronic devices having only two independent circuits. For example, an alternate embodiment may include a device with three or more circuits, and isolation structures may be provided between each pair of adjacent circuits. In addition, although various embodiments have been described with respect to overmolded (encapsulated) semiconductor device packages, the inventive concepts also could be applied to air cavity housings and other types of package housings.

In one embodiment, a semiconductor device includes a substrate, a first circuit on the substrate and comprising a plurality of electrical components, and a second circuit on the substrate and comprising a plurality of electrical components. The semiconductor device includes an isolation structure formed of electrically conductive material located between the first circuit and the second circuit. The isolation structure is configured to reduce electromagnetic coupling between the first circuit and the second circuit during an operation of at least one of the first circuit and the second circuit.

In another embodiment, a Doherty amplifier includes a substrate, a carrier amplifier on the substrate, and a peaking amplifier on the substrate adjacent to the carrier amplifier. The Doherty amplifier includes an isolation structure formed of electrically conductive material located between the carrier amplifier and the peaking amplifier. The isolation structure is configured to reduce an electromagnetic coupling between the carrier amplifier and the peaking amplifier during an operation of the Doherty amplifier.

In another embodiment, a semiconductor device includes a substrate, a first circuit on the substrate, a second circuit on the substrate, a housing extending over the first circuit and the second circuit, and an isolation structure. The housing includes a major surface and first and second edge surfaces both abutting the major surface. The isolation structure includes a first leg proximate to (e.g., on, overlying, or underlying) the first edge surface and a first cross member proximate to (e.g., on, overlying, or underlying) the major surface and electrically connected to the first leg. The isolation structure is configured to reduce electromagnetic coupling between the first circuit and the second circuit during an operation of at least one of the first circuit and the second circuit.

In another embodiment, a semiconductor device includes a substrate having a surface, electronic circuitry on the substrate and including a plurality of electrical components, where the circuitry has an input and an output, and an isolation structure having a first cross member spaced from and extending over the surface of the substrate between the input and the output. The isolation structure is configured to reduce electromagnetic coupling between the input and the output during an operation of the circuitry.

In another embodiment, a system includes a packaged semiconductor device and an isolation structure. The packaged semiconductor device includes a substrate having a surface, a first circuit on the substrate and comprising a plurality of electrical components, and a second circuit on the substrate and comprising another plurality of electrical components. The isolation structure has a first cross member spaced from and extending over the surface of the substrate between the first circuit and the second circuit. The isolation structure is configured to reduce electromagnetic coupling between the first circuit and the second circuit during an operation of at least one of the first circuit and the second circuit.

In another embodiment, a method of fabricating a semiconductor device includes forming a first circuit on a substrate, and forming a second circuit on a substrate adjacent to the first circuit. The method includes locating an isolation structure of electrically conductive material between the first circuit and the second circuit. The isolation structure is configured to reduce electromagnetic coupling between the first circuit and the second circuit during an operation of the semiconductor device.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A semiconductor device comprising:
a substrate having a surface;
a first circuit on the substrate and comprising a plurality of electrical components;
a second circuit on the substrate and comprising another plurality of electrical components;
a housing coupled to the substrate, wherein the housing includes a major surface above the surface of the substrate, and an edge surface orthogonal to the major surface and the surface of the substrate, and wherein the housing encloses the first and second circuits;
first and second connectors that project outward from the edge surface of the housing, wherein the first connector is coupled to the first circuit, the second connector is coupled to the second circuit, and the first and second connectors are physically separated from each other by a first distance across a portion of the edge surface;
a ground connector that projects outward from the edge surface of the housing between the first and second connectors; and
an isolation structure having an elongated first cross member coupled to the housing, and spaced from and extending over the surface of the substrate between the first circuit and the second circuit, wherein a length of the first cross member is greater than a width of the first cross member, and an area of the first cross member is smaller than an area of the surface of the substrate, and wherein the isolation structure further includes a first leg coupled to the housing and extending transverse to the first cross member and to the surface of the substrate, wherein the first leg is directly connected to the ground connector, the first leg has a width dimension that is parallel to and smaller than the first distance between the first and second connectors, and wherein the isolation structure is configured to reduce electromagnetic coupling between the first circuit and the second circuit during an operation of at least one of the first circuit and the second circuit.

2. The semiconductor device as recited in claim 1, wherein the isolation structure is formed of electrically conductive material.

3. The semiconductor device as recited in claim 1, wherein the first cross member is located on the major surface of the housing.

4. The semiconductor device as recited in claim 1, wherein the first cross member is within the housing.

5. The semiconductor device as recited in claim 1, wherein the isolation structure further comprises a second leg extending transverse to the surface of the substrate and attached to the first cross member.

6. A semiconductor device comprising:
a substrate having a surface;
a first circuit on the substrate and comprising a plurality of electrical components;
a second circuit on the substrate and comprising another plurality of electrical components;
a housing coupled to the substrate, wherein the housing includes a major surface above the surface of the substrate, and an edge surface orthogonal to the major surface and the surface of the substrate, and wherein the housing encloses the first and second circuits;
first and second connectors that project outward from the housing, wherein the first connector is coupled to the first circuit, and the second connector is coupled to the second circuit;
a ground connector that projects outward from the edge surface of the housing between the first and second connectors; and
an isolation structure having a first cross member coupled to the housing, and spaced from and extending over the surface of the substrate between the first circuit and the second circuit, a first leg coupled to the housing and extending transverse to the first cross member and to the surface of the substrate, wherein the first leg is directly connected to the ground connector, and a second cross member spaced from and extending over the surface of the substrate, and wherein the isolation structure is configured to reduce electromagnetic coupling between the first circuit and the second circuit during an operation of at least one of the first circuit and the second circuit.

7. The semiconductor device as recited in claim 6 wherein the first cross member is electrically connected in common with the second cross member.

8. A semiconductor device comprising:
a substrate;
a first circuit on the substrate;
a second circuit on the substrate;
a housing coupled to the substrate, extending over and enclosing the first circuit and the second circuit, and comprising a major surface and first and second edge surfaces both abutting the major surface;
first and second connectors that project outward from the edge surface of the housing, wherein the first connector is coupled to the first circuit, the second connector is coupled to the second circuit, and the first and second connectors are physically separated from each other by a first distance across a portion of the edge surface;
a ground connector that projects outward from the housing and is located between the first and second connectors; and
an isolation structure comprising a first leg coupled to and proximate to the first edge surface and an elongated first cross member coupled to and proximate to the major surface and electrically connected to the first leg, wherein the first leg is directly connected to the ground connector, wherein the first leg has a width dimension that is parallel to and smaller than the first distance between the first and second connectors, wherein a length of the first cross member is greater than a width of the first cross member, and an area of the first cross member is smaller than an area of the surface of the substrate, and wherein the isolation structure is configured to reduce electromagnetic coupling between the first circuit and the second circuit during an operation of at least one of the first circuit and the second circuit.

9. The semiconductor device as recited in claim 8, wherein the isolation structure further comprises a second leg formed on the second edge surface and electrically connected to the first cross member.

10. A semiconductor device comprising:
a substrate;
a first circuit on the substrate;
a second circuit on the substrate;
a housing coupled to the substrate, extending over and enclosing the first circuit and the second circuit, and comprising a major surface and first and second edge surfaces both abutting the major surface;
first and second connectors that project outward from the housing, wherein the first connector is coupled to the first circuit, and the second connector is coupled to the second circuit;
a ground connector that projects outward from the housing and is located between the first and second connectors; and
an isolation structure comprising
a first leg coupled to and proximate to the first edge surface,
a first cross member coupled to and proximate to the major surface and electrically connected to the first leg, and
a second cross member on the major surface and electrically coupled to the first cross member,
wherein the first leg is directly connected to the ground connector, and wherein the isolation structure is configured to reduce electromagnetic coupling between the first circuit and the second circuit during an operation of at least one of the first circuit and the second circuit.

11. A semiconductor device comprising:
a substrate;
a first circuit on the substrate;
a second circuit on the substrate;
a housing coupled to the substrate, extending over and enclosing the first circuit and the second circuit, and comprising a major surface and first and second edge surfaces both abutting the major surface;
first and second connectors that project outward from the housing, wherein the first connector is coupled to the first circuit, and the second connector is coupled to the second circuit;
a ground connector that projects outward from the housing and is located between the first and second connectors; and
an isolation structure comprising
a first leg coupled to and proximate to the first edge surface,
a first cross member coupled to and proximate to the major surface and electrically connected to the first leg,
an additional leg formed on one of the first edge surface and the second edge surface, and
a second cross member formed on the major surface and electrically connected to the additional leg,
wherein the first leg is directly connected to the ground connector, and wherein the isolation structure is configured to reduce electromagnetic coupling between the first circuit and the second circuit during an operation of at least one of the first circuit and the second circuit.

12. The semiconductor device as recited in claim 11 wherein the first cross member is electrically connected in common with the second cross member.

13. A semiconductor device comprising:
a substrate having a surface;
a housing coupled to the substrate, wherein the housing includes a major surface above the surface of the substrate, first and second edge surfaces orthogonal to the major surface and the surface of the substrate, and a third edge surface orthogonal to the major surface and extending between the first and second edge surfaces;
a first connector that projects outward from the first edge surface of the housing;
a second connector that projects outward from the second edge surface of the housing;
electronic circuitry on the substrate and comprising a plurality of electrical components, wherein the circuitry has one or more first electrical devices coupled to the first connector, and one or more second electrical devices coupled to the second connector, wherein the first and second electrical devices are electrically coupled together within the housing, and wherein the housing encloses the first and second electrical devices;
a ground connector that projects outward from the third edge surface between the first and second connectors; and
an isolation structure having an elongated first cross member coupled to the housing, and spaced from and extending over the surface of the substrate between the first and second electrical devices, wherein a length of the first cross member is greater than a width of the first cross member, and an area of the first cross member is smaller than an area of the surface of the substrate, and wherein the isolation structure further includes a first leg coupled to the housing and extending transverse to the first cross member and to the surface of the substrate, wherein the first leg is directly connected to the ground connector, the first leg has a width dimension that is parallel to and smaller than a distance between the first and second edge surfaces, and wherein the isolation structure is configured to reduce electromagnetic coupling between the first and second electrical devices during an operation of the circuitry.

14. The semiconductor device as recited in claim 13, wherein the isolation structure is formed of electrically conductive material.

15. The semiconductor device as recited in claim 13, wherein the first cross member is located on an exterior surface of the housing.

16. The semiconductor device as recited in claim 13, wherein the first cross member is within the housing.

17. The semiconductor device as recited in claim 13, wherein the isolation structure further comprises a second leg extending transverse to the surface of the substrate and attached to the first cross member.

18. A semiconductor device comprising:
a substrate having a surface;
a housing coupled to the substrate, wherein the housing includes a major surface above the surface of the substrate, and first and second edge surfaces orthogonal to the major surface and the surface of the substrate;
a first connector that projects outward from the first edge surface of the housing;
a second connector that projects outward from the second edge surface of the housing;
electronic circuitry on the substrate and comprising a plurality of electrical components, wherein the circuitry has one or more first electrical devices coupled to the first connector, and one or more second electrical devices coupled to the second connector, wherein the first and second electrical devices are electrically coupled together within the housing, and wherein the housing encloses the first and second electrical devices;
a ground connector that projects outward from the housing between the first and second connectors; and
an isolation structure having
a first cross member coupled to the housing, and spaced from and extending over the surface of the substrate between the first and second electrical devices,
a second cross member spaced from and extending over the surface of the substrate, and
a first leg coupled to the housing and extending transverse to the first cross member and to the surface of the substrate,
wherein the first leg is directly connected to the ground connector, and wherein the isolation structure is configured to reduce electromagnetic coupling between the first and second electrical devices during an operation of the circuitry.

19. The semiconductor device as recited in claim 18 wherein the first cross member is electrically connected in common with the second cross member.

20. A system comprising:
a packaged semiconductor device that includes:
a substrate having a surface,
a first circuit on the substrate and comprising a plurality of electrical components, and
a second circuit on the substrate and comprising another plurality of electrical components;
a housing coupled to the substrate, wherein the housing includes a major surface above the surface of the substrate, and an edge surface orthogonal to the major surface and the surface of the substrate, and wherein the housing encloses the first and second circuits;
first and second connectors that project outward from the edge surface of the housing, wherein the first connector is coupled to the first circuit, the second connector is coupled to the second circuit, and the first and second connectors are physically separated from each other by a first distance across a portion of the edge surface;
a ground connector that projects outward from the edge surface of the housing between the first and second connectors; and
an isolation structure having an elongated first cross member coupled to the housing, and spaced from and extending over the surface of the substrate between the first circuit and the second circuit, wherein a length of the first cross member is greater than a width of the first cross member, and an area of the first cross member is smaller than an area of the surface of the substrate, and wherein the isolation structure further includes a first leg coupled to the housing and extending transverse to the first cross member and to the surface of the substrate, wherein the first leg is directly connected to the ground connector, the first leg has a width dimension that is parallel to and smaller than the first distance between the first and second connectors, and wherein the isolation structure is configured to reduce electromagnetic coupling between the first circuit and the second circuit during an operation of at least one of the first circuit and the second circuit.

21. The system of claim 20, wherein the isolation structure is coupled to at least one lead of the packaged semiconductor device.

22. The system of claim 20, wherein the isolation structure is coupled to a conductive flange to which the first circuit and the second circuit are coupled.

23. A system comprising:
a packaged semiconductor device that includes:
a substrate having a surface,
a first circuit on the substrate and comprising a plurality of electrical components, and
a second circuit on the substrate and comprising another plurality of electrical components,
a housing coupled to the substrate, wherein the housing includes a major surface above the surface of the substrate, and an edge surface orthogonal to the major surface and the surface of the substrate, and wherein the housing encloses the first and second circuits,
first and second connectors that project outward from the housing, wherein the first connector is coupled to the first circuit, and the second connector is coupled to the second circuit,
a ground connector that projects outward from the edge surface of the housing between the first and second connectors, and
an isolation structure having a first cross member coupled to the housing, and spaced from and extending over the surface of the substrate between the first circuit and the second circuit, and a first leg coupled to the housing and extending transverse to the first cross member and to the surface of the substrate, wherein the first leg is directly connected to the ground connector, and wherein the isolation structure is configured to reduce electromagnetic coupling between the first circuit and the second circuit during an operation of at least one of the first circuit and the second circuit; and a circuit board to which the packaged semiconductor device is coupled, wherein the isolation structure is coupled to the circuit board and extends over the packaged semiconductor device.

24. A method of fabricating a circuit with isolation between portions of the circuit, the method comprising:

forming a first circuit on a substrate of a semiconductor device;

forming a second circuit on the substrate adjacent to the first circuit;

coupling a housing to the substrate, wherein the housing includes a major surface above the surface of the substrate, and an edge surface orthogonal to the major surface and the surface of the substrate, and wherein the housing encloses the first and second circuits;

coupling a first connector to the first circuit, wherein the first connector projects outward from the edge surface of the housing;

coupling a second connector to the second circuit, wherein the second connector projects outward from the edge surface of the housing, and the first and second connectors are physically separated from each other by a first distance across a portion of the edge surface;

coupling a ground connector to the housing, wherein the ground connector projects outward from the housing between the first and second connectors; and coupling an isolation structure of electrically conductive material to the housing between the first circuit and the second circuit, the isolation structure having at least an elongated first cross member coupled to the housing, and spaced from and extending over the surface of the substrate between the first circuit and the second circuit, wherein a length of the first cross member is greater than a width of the first cross member, and an area of the first cross member is smaller than an area of the surface of the substrate, and wherein the isolation structure further includes a first leg coupled to the housing and extending transverse to the first cross member and to the surface of the substrate, wherein the first leg is directly connected to the ground connector, the first leg has a width dimension that is parallel to and smaller than the first distance between the first and second connectors, and wherein the isolation structure is configured to reduce electromagnetic coupling between the first circuit and the second circuit during an operation of at least one of the first circuit and the second circuit.

25. The method as recited in claim 24 wherein the cross member and the first leg are formed on at least one surface of the housing.

26. The method as recited in claim 24 wherein coupling an isolation structure further comprises extending a second leg transverse to a plane of the substrate, wherein the second leg is electrically connected to the cross member.

* * * * *